United States Patent
Herbst et al.

(10) Patent No.: US 12,153,353 B2
(45) Date of Patent: Nov. 26, 2024

(54) DRIVE DEVICE, OPTICAL SYSTEM AND LITHOGRAPHY APPARATUS

(71) Applicant: Carl Zeiss SMT GmbH, Oberkochen (DE)

(72) Inventors: Oliver Herbst, Aalen (DE); Cornelius Richt, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 51 days.

(21) Appl. No.: 17/967,163

(22) Filed: Oct. 17, 2022

(65) Prior Publication Data
US 2023/0051439 A1    Feb. 16, 2023

Related U.S. Application Data

(63) Continuation of application No. PCT/EP2021/060228, filed on Apr. 20, 2021.

(30) Foreign Application Priority Data

Apr. 21, 2020  (DE) .................. 102020205044.9

(51) Int. Cl.
*G03F 7/20*  (2006.01)
*G03F 7/00*  (2006.01)

(52) U.S. Cl.
CPC ...... *G03F 7/70825* (2013.01); *G03F 7/70258* (2013.01)

(58) Field of Classification Search
CPC ............ G03F 7/70825; G03F 7/70258; G03F 7/70266; G02B 5/0891; H02M 1/007; H02M 1/14; H02M 3/158; H03F 3/2171
See application file for complete search history.

(56) References Cited

U.S. PATENT DOCUMENTS

| | | | |
|---|---|---|---|
| 7,746,935 B2 | 6/2010 | Bonfiglio | |
| 2006/0256874 A1 | 11/2006 | Bonfiglio | |
| 2017/0085189 A1* | 3/2017 | Madsen | .......... H02M 1/44 |
| 2019/0302626 A1 | 10/2019 | Krone et al. | |

FOREIGN PATENT DOCUMENTS

| | | |
|---|---|---|
| DE | 10 2019 211 477 | 2/2021 |
| EP | 2 648 324 A2 | 10/2013 |

OTHER PUBLICATIONS

Rüedi Heinz: "AN-9902 Application Note Two and four-quadrant DC/DC converters with SCALE drivers NOTES for the use of dead-time logic", May 24, 1999 (May 24, 1999). URL:https://www.5scomponents.com/pdf/AN9902E_2_and_4_quadrant_dc2dc_converters.pdf.

(Continued)

*Primary Examiner* — Mesfin T Asfaw (74) *Attorney, Agent, or Firm* — Fish & Richardson P.C.

(57) ABSTRACT

A drive device for driving an actuator of an optical system comprises: a switching amplifier for generating an amplified signal depending on a modulation signal; a filter unit connected between the actuator and the switching amplifier and having at least one inductance; a providing unit for providing a supply voltage; and a two-quadrant controller having feedback capability coupled between the providing unit and the switching amplifier.

20 Claims, 8 Drawing Sheets

(56) References Cited

OTHER PUBLICATIONS

Janocha H et al., "New Approach to a Switching Amplifier for Piezoelectric Actuators", Dec. 31, 1998 (Dec. 31, 1998), pp. 1-4. URL:http://www.lpa.uni-saarland.de/pdf/Act_uator98.pdf.
Thummala Prasanth et al: "High voltage Bi-directional flyback converter for capacitive actuator", 2013 15TH European Conference on Power Electronics and Applications (EPE), IEEE, Sep. 2, 2013 (Sep. 2, 2013), pp. 1-10.
International Search Report and Written Opinion for PCT Appl No. PCT/EP2021/060228, mailed Jul. 12, 2021.

* cited by examiner

DRIVE DEVICE, OPTICAL SYSTEM AND LITHOGRAPHY APPARATUS

CROSS-REFERENCE TO RELATED APPLICATIONS

The present application is a continuation of, and claims benefit under 35 USC 120 to, international application PCT/EP2021/060228, filed Apr. 20, 2021, which claims benefit under 35 USC 119 of German Application No. 10 2020 205 044.9, filed Apr. 21, 2020. The entire disclosure of these applications are incorporated by reference herein.

FIELD

The present disclosure relates to a drive device for driving an actuator of an optical system, to an optical system comprising such a drive device, and to a lithography apparatus comprising such an optical system.

BACKGROUND

Microlithography apparatuses are known which have actuatable optical elements, such as microlens element arrays or micromirror arrays, for example. Microlithography is used for producing microstructured components, such as integrated circuits, for example. The microlithography process is performed using a lithography apparatus, which has an illumination system and a projection system. The image of a mask (reticle) illuminated via the illumination system is in this case projected via the projection system onto a substrate, for example a silicon wafer, which is coated with a light-sensitive layer (photoresist) and arranged in the image plane of the projection system, in order to transfer the mask structure to the light-sensitive coating of the substrate. The imaging of the mask on the substrate can be improved via actuatable optical elements. By way of example, wavefront aberrations during exposure, which can result in magnified and/or unsharp imagings, can be compensated for.

Such correction with the optical element can involve detection of the wavefront and signal processing in order to determine a respective position of an optical element which enables the wavefront to be corrected as desired. In the last step, it can be desirable to amplify the drive signal for a respective optical element and to output it to the actuator of the optical element.

By way of example, the drive signal is present as a digitally encoded deflection of the actuator, wherein the deflection is proportional to the drive voltage, for example. Digital signals are amplified using switching amplifiers, for example, which are controlled internally with a modulation of the drive signal. U.S. Pat. No. 7,746,935 B2 describes a device configured for driving a capacitive load depending on a digital input signal using a switching amplifier.

Switching amplifiers constitute an efficient realization for driving optical systems in order to charge and discharge a large number of capacitive actuators with high capacitance in a limited time. One example in this respect: the actuator is discharged at 0 V and charged at 100 V. However, the switching amplifier can also set any state of charge between maximum and minimum voltage. Energy is added to the actuator during charging and removed from the actuator during discharging. A larger charge difference, i.e. voltage difference, at the actuator or actuator capacitance means a higher charge-reversal current with a shorter charge-reversal duration.

After the charging process, energy is stored in the capacitive actuators. In order to discharge the actuators, it can be desirable to dissipate the energy from the actuator. The energy to be dissipated is conventionally converted into thermal energy. It can be undesirable for the thermal energy to not be utilized. As a result of the thermal energy, for example if sufficient cooling is not provided, adjacent optical and/or mechanical components can be adversely influenced by heating.

SUMMARY

The present disclosure seeks to improve the driving of an actuator of an optical system.

In accordance with a first aspect, a drive device for driving an actuator of an optical system is proposed. The drive device comprises a switching amplifier for generating an amplified signal depending on a modulation signal, a filter unit connected between the actuator and the switching amplifier and having at least one inductance, a providing unit for providing a supply voltage, and a two-quadrant controller having feedback capability coupled between the providing unit and the switching amplifier.

Furthermore, the drive device can comprise a modulation device for generating a modulation signal depending on an input signal. By way of example, the modulation signal is generated with a frequency of 1 MHz. The actuator is, for example, a capacitive or electromagnetic actuator.

The two-quadrant controller with feedback capability can fulfil two functions in the present drive device. Firstly, energy can be transported away from the actuator during the discharging process of the actuator. Secondly, the energy transported away can be utilized again on account of the feedback capability of the two-quadrant controller. If a providing unit having feedback capability is used, for example, then the energy fed back from the actuator can be transported away from the entire system of the drive device and can be provided for other devices in the optical system, for example. Alternatively or additionally, the energy fed back from the actuator via the two-quadrant controller can be buffer-stored in a storage element of the drive device, for example in a capacitor, in order to be used for a later charging process of the actuator.

Since the energy stored in the actuator is transported away from the latter, optionally it does not have to be converted into heat. Discharge circuits in the drive device can be obviated as a result. As a result, the entire system of the drive device also has to be cooled to a lesser extent than conventional drive devices.

The providing unit is for example a voltage source, an energy store, for example a battery, an interface or a plug.

The supply voltage can be an AC voltage, such as the mains voltage, or a DC voltage.

In accordance with one embodiment, the two-quadrant controller is configured to convert, for example to step up, an input voltage present on the voltage source side into an output voltage present on the switching amplifier side, and to convert, for example to step down, an input voltage present on the switching amplifier side into an output voltage present on the voltage source side.

In accordance with a further embodiment, the providing unit has feedback capability.

In the case of this embodiment with the providing unit having feedback capability, it is possible for the energy stored in the actuator to be transported away from the entire system of the drive device via the two-quadrant controller having feedback capability and the providing unit having feedback capability and to be made available to other devices of the optical system.

In accordance with a further embodiment, the two-quadrant controller and the switching amplifier are connected via a first node, wherein a link circuit capacitor is connected between the first node and ground.

The link circuit capacitor can be suitable for storing energy in the drive device, for example energy transported away from the actuator.

In accordance with a further embodiment, the two-quadrant controller is embodied as a synchronous boost controller, wherein the providing unit and the synchronous boost controller are connected via a second node.

In accordance with a further embodiment, the two-quadrant controller is embodied as a synchronous buck controller.

The synchronous boost controller can be configured to convert energy in both directions. By way of example, the synchronous boost controller steps up an input voltage of 24 V present on the voltage source side into an output voltage of 120 V present on the switching amplifier side and correspondingly converts an input voltage of 120 V present on the switching amplifier side into an output voltage of 24 V present on the voltage source side.

In accordance with a further embodiment, the two-quadrant controller has a parallel connection of a boost controller for feeding in energy to the switching amplifier and a synchronous boost controller for feeding back energy to the providing unit having feedback capability, and a linear voltage regulator connected downstream of the parallel connection and coupled to the switching amplifier.

By way of example, the boost controller converts an input voltage of 24 V into an output voltage of 130 V. The synchronous boost controller converts the input voltage from 24 V to 110 V, for example. The voltage regulator connected downstream thereof can correct the voltages received on the input side in order to avoid voltage ripples.

In accordance with a further embodiment, the two-quadrant controller has a parallel connection of a boost controller for feeding in energy to the switching amplifier and a buck controller for feeding back energy to the providing unit having feedback capability, and a linear voltage regulator connected downstream of the parallel connection and coupled to the switching amplifier.

In this embodiment, the buck controller constitutes an alternative to the synchronous boost controller described in the previous embodiment.

In accordance with a further embodiment, the providing unit is embodied as a buck controller, wherein a boost controller can be connected between the buck controller and the two-quadrant controller.

By way of example, the buck controller is suitable for converting an AC voltage of 230 V received on the input side into a DC voltage of 24 V. The DC voltage of 24 V then provided can be stepped up to 150 V by the boost controller. The two-quadrant controller disposed downstream of the boost controller is then configured for example for converting between 150 V DC voltage and 120 V DC voltage.

In accordance with a further embodiment, the boost controller and the two-quadrant controller are coupled via a third node, wherein a storage element for energy fed back from the actuator is connected between the third node and ground.

The storage element is embodied for example as a capacitor or a circuit comprising a plurality of capacitors.

In accordance with a further embodiment, an electronic component which allows current to pass in one direction and blocks the current flow in the other direction is connected between the boost controller and the third node. The electronic component is a diode, for example.

The diode can block a current flow from the two-quadrant controller to the boost controller, such that energy fed back is stored in the storage element discussed above.

In accordance with a further embodiment, the switching amplifier comprises a half H-bridge. The switching amplifier can also be referred to as a class-D amplifier. Such amplifiers have discrete voltage levels which can be output. By way of example, such amplifiers have exactly two levels, e.g. 0 V and 48 V, or else −24 V and +24 V. Furthermore, the switching amplifier can also have more than two levels. The respective voltage levels which can be output by the switching amplifier depend, for example, on the providing units with which the switching amplifier is operated. The voltage levels can therefore be chosen freely, depending on the specific application, by the providing units being chosen accordingly. One of the voltage levels can be the ground potential. Voltage values lying between the voltage levels are output as a rectangular signal with a corresponding root-mean-square value, that is to say by rapid switching, for example using hybrid pulse width modulation. Subsequent filtering results in a DC voltage signal with the root-mean-square value, wherein relatively small fluctuations may still be present in the filtered signal, depending on the filter Q factor.

A half H-bridge corresponds to one half of an H-bridge circuit. By way of example, the latter comprises two switching transistors, of which one is configured for switching a first voltage level and the second is configured for switching a second voltage level, wherein the switching transistors are switched alternately, such that only one in each case is switched on. The switching transistors are switched for example depending on the pulse width modulation signal of the modulation device. It should be noted that the switching amplifier can also have a full bridge circuit or H-bridge.

In accordance with a further embodiment, the filter unit comprises the inductance, a resistor and a capacitance.

The filter unit forms for example a low-pass filter that smooths the amplified signal over time. The filtered signal can correspond to a time average value of the amplified signal. The filter unit can for example be embodied as a multi-stage filter and have both inductances and capacitances. The filter unit can be configured to filter the amplified signal such that a remaining AC component in the filtered signal is less than 0.1% of the amplitude. The filter unit can also be referred to as a demodulator.

The filter unit can be embodied at least as a second-order filter. For example, the filter unit can be embodied as a higher-order, for example fourth-order, filter. Higher filter orders can be realized for example by a cascade of lower-order filters. In this case, the filter unit is embodied for example as a passive filter. The filter unit has for example a cut-off frequency from a range of 1 kHz-10 kHz. A slope of the filter unit and also a type of the filter unit, for example whether the filter unit is embodied as a Butterworth filter, a Chebyshev filter, a Bessel filter, a Sallen-key filter or some other type of filter, are selected specifically for a respective application.

The respective boost controller can also be referred to as a step-up converter, step-up controller or boost converter. The respective buck controller can also be referred to as a step-down converter, step-down controller or buck converter.

In accordance with a second aspect, an optical system comprising a number of actuatable optical elements is proposed. Each of the actuatable optical elements of the number is assigned an actuator and each actuator is assigned a drive device for driving the actuator in accordance with the first aspect or one of the embodiments of the first aspect.

The optical system comprises, for example, a micromirror array and/or a microlens element array having a multiplicity of optical elements that are actuatable independently of one another.

In embodiments, groups of drive devices can be defined, wherein all drive devices of a group have the same switching instant, but different groups each have different switching instants.

In accordance with one embodiment of the optical system, a respective one of the actuators comprises a capacitive and/or an inductive load.

Depending on the specific embodiment of the filter unit of the drive devices, a power loss produced in a respective actuator can be reduced, which can result in desirable features in the cooling of the optical system. This can be achieved, for example, if the filter unit has a capacitor connected in parallel with the actuator.

In accordance with a third aspect, a lithography apparatus comprising an optical system in accordance with the second aspect or one of the embodiments of the second aspect is proposed.

A lithography apparatus comprises an illumination system and an imaging system, for example. The illumination system comprises, for example, a light source and a beam-shaping optical unit. The imaging system comprises, for example, an imaging optical unit for imaging the mask onto the substrate.

The optical system can be used both in the illumination system, in the beam-shaping optical unit, and in the imaging system. In some embodiments, the optical system is embodied as a microlens element array or a micromirror array and serves for example for wavefront correction in the imaging system.

The lithography apparatus is for example an EUV lithography apparatus, the working light of which is in a wavelength range of 0.1 nm to 30 nm, or a DUV lithography apparatus, the working light of which is in a wavelength range of 30 nm to 250 nm.

The lithography apparatus can additionally comprise a measuring system configured for detecting a wavefront and configured for outputting a correction signal for correcting the wavefront via the optical system. The correction signal can serve for example as the input signal for the drive device.

Moreover, a further example of a drive device for driving an actuator of an optical system is proposed. The drive device comprises a switching amplifier for generating an amplified signal depending on a modulation signal, a filter unit connected between the actuator and the switching amplifier and having at least one inductance, a providing unit for providing a supply voltage, the providing unit being connected to the switching amplifier via a node and optionally having a buck controller and a boost controller, wherein a chopper circuit for energy fed back from the actuator is connected between the node and ground.

The chopper circuit can comprise a series connection of a resistor and a transistor, the series connection being connected between the node and ground. A link circuit capacitor can be arranged in parallel with the chopper circuit and the switching amplifier.

"A(n); one" in the present case should not necessarily be understood as restrictive to exactly one element. Rather, a plurality of elements, such as, for example, two, three or more, can also be provided. Any other numeral used here, too, should not be understood to the effect that there is a restriction to exactly the stated number of elements. Rather, numerical deviations upwards and downwards are possible, unless indicated to the contrary.

Further possible implementations of the disclosure also comprise not explicitly mentioned combinations of features or embodiments that are described above or below with respect to the exemplary embodiments. In this case, a person skilled in the art will also add individual aspects as improvements or supplementations to the respective basic form of the disclosure.

Further configurations and aspects of the disclosure are the subject matter of the dependent claims and also of the exemplary embodiments of the disclosure described below. In the text that follows, the disclosure is explained in more detail on the basis of embodiments and with reference to the accompanying figures.

EXEMPLARY EMBODIMENTS

Identical elements or elements having an identical function have been provided with the same reference signs in the figures, unless indicated to the contrary. It should also be noted that the illustrations in the figures are not necessarily true to scale.

Figure 1:
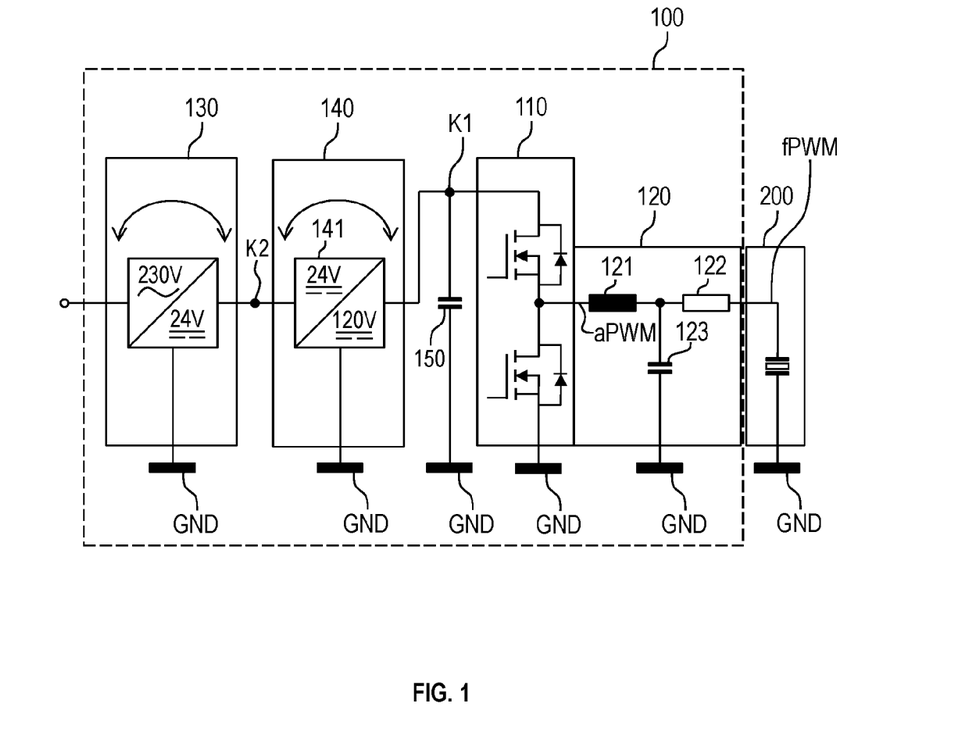
FIG. 1 shows a schematic block diagram of a drive device for driving an actuator of an optical system.
Figure 5:
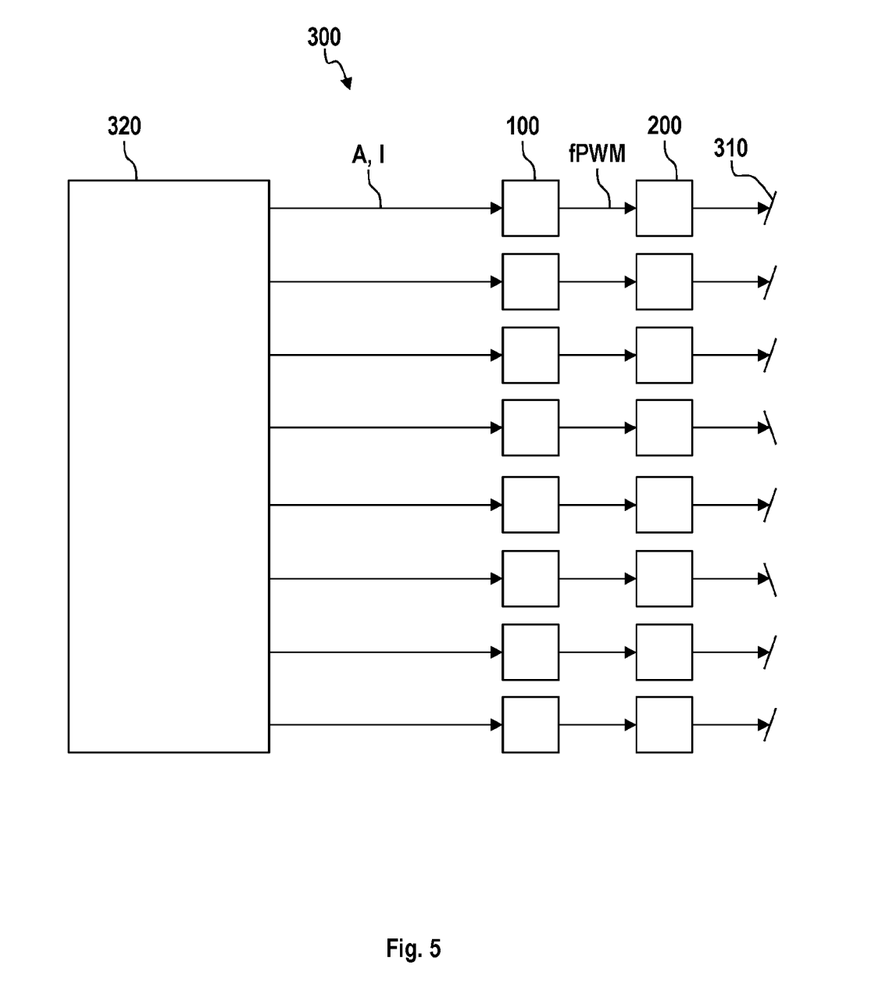
FIG. 5 shows a schematic block diagram of an embodiment of an optical system.
Figure 6A:
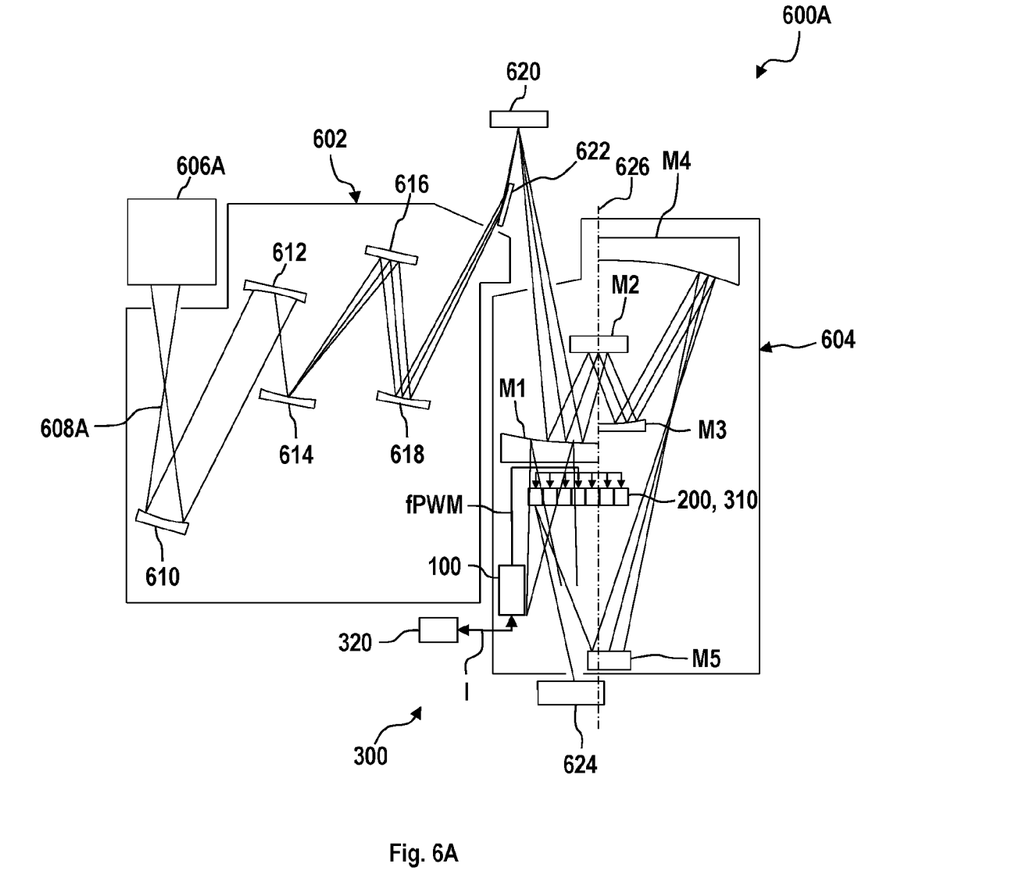
FIG. 6A shows a schematic view of an embodiment of an EUV lithography apparatus.
Figure 6B:
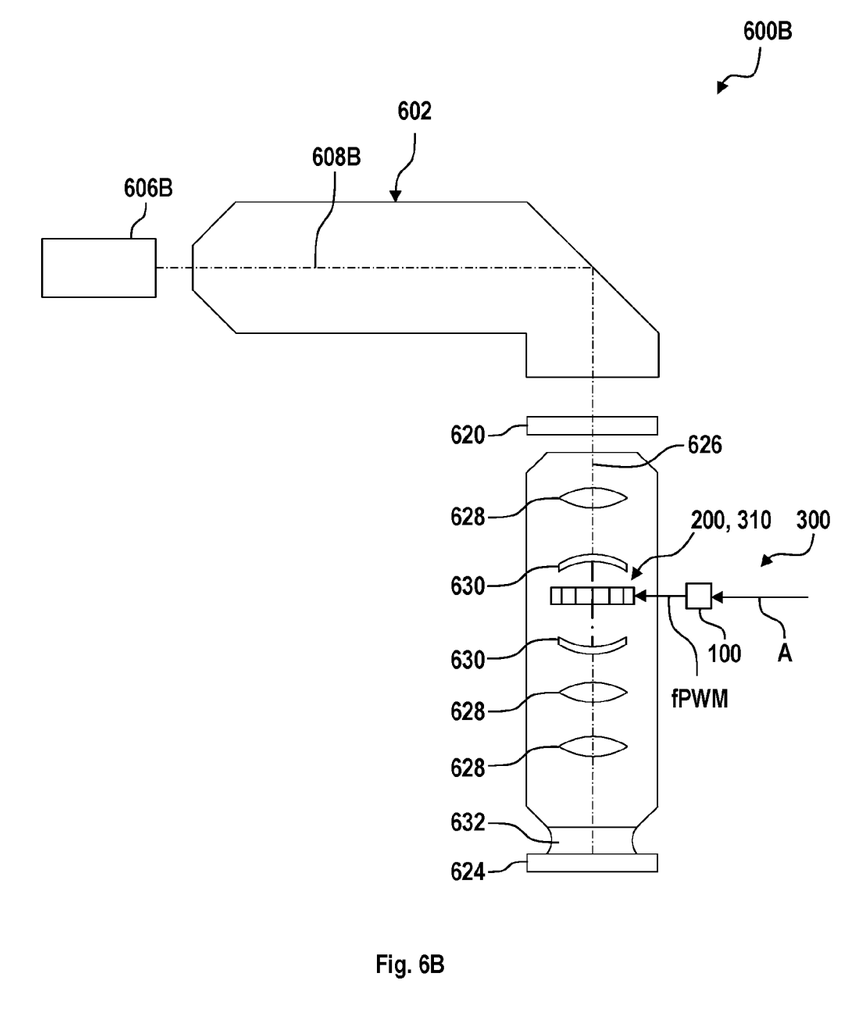
FIG. 6B shows a schematic view of an embodiment of a DUV lithography apparatus.

FIG. 1 shows a schematic block diagram of a first embodiment of a drive device 100 for driving an actuator 200 of an optical system 300. Examples of an optical system 300 are shown in FIGS. 5, 6A and 6B.

The actuator 200 can be embodied as a capacitive actuator, for example. Further possible actuators 200 are electrical actuators, magnetic actuators, electromagnetic actuators, thermal actuators and suchlike.

The drive device 100 in FIG. 1 comprises a switching amplifier 110, a filter unit 120 connected between the switching amplifier 110 and the actuator 200, and also a providing unit 130 and a two-quadrant controller 140 connected between the providing unit 130 and the switching amplifier 110. In the figures, the providing unit 130 is embodied as a voltage source. The providing unit 130 can also be embodied as an energy store, for example as a battery, as an interface or as a plug.

The switching amplifier 110 is configured to generate an amplified signal aPWM depending on a modulation signal (not shown). In this case, the capacitors of the switching amplifier 110 are driven by the modulation signal (not shown). The modulation signal is provided via a modulation device and a gate driver connected between the modulation device and the gate terminals of the transistors of the switching amplifier 110. Such a modulation device and such a gate driver are disclosed in the patent application DE 10 2019 211 447.6, the content of which is incorporated by reference in its entirety.

In the present case, the switching amplifier 110 is embodied as a half H-bridge. In this case, the transistors of the switching amplifier 110 are embodied as n-channel MOSFETs.

Alternatively, the transistors can also be embodied as p-channel MOSFETs, as a p-channel and an n-channel MOSFET, silicon MOSFETs, GaN FETs, IGBTs and/or bipolar transistors.

The voltage source 130 is suitable for example for converting an AC voltage of 230 V into a DC voltage of 24 V. In this case, the voltage source 130 in FIG. 1 has feedback capability.

The property of the feedback capability of the voltage source 130 is illustrated by a double-headed arrow in FIG. 1.

The two-quadrant controller 140 in FIG. 1 has a synchronous boost controller 141. The synchronous boost controller 141 in FIG. 1 is configured to step up an input voltage of 24 V present on the voltage source side into an output voltage of 120 V present on the switching amplifier side and to step down an input control voltage of 120 V present on the switching amplifier side into an output voltage of 24 V present on the voltage source side.

The two-quadrant controller 140 in FIG. 1 and the switching amplifier 110 are connected via a first node K1. A link circuit capacitor 150 is connected between the first node K1 and ground GND. The synchronous boost controller 141 and the voltage source 130 are connected via a second node K2.

The filter unit 120 is configured to filter the amplified signal aPWM provided by the switching amplifier 110 on the input side and, depending on that, to provide a filtered signal fPWM for the actuator 200 on the output side.

The filter unit 120 comprises, for example, an inductance 121, for example a coil, connected in series with the actuator 200, and also a resistor 122, for example an ohmic resistor, and a capacitance 123 connected in parallel with the actuator 200. The specific choice of values for the inductance 121, the resistor 122 and the capacitor 123 depends on the actuator 200 to be driven and the desired properties of the filtered signal fPWM.

It should be noted that the filter unit 120 need not necessarily have all the components shown, but rather also has for example only an inductance 121 and a resistor 122, but not a capacitor 123. Further arrangements of the individual components are likewise possible and can be chosen depending on the actuator 200 to be driven and the desired properties of the filtered signal fPWM.

It should be noted that any desired potential provided by a voltage source can be used instead of the ground potential GND.

Figure 2:
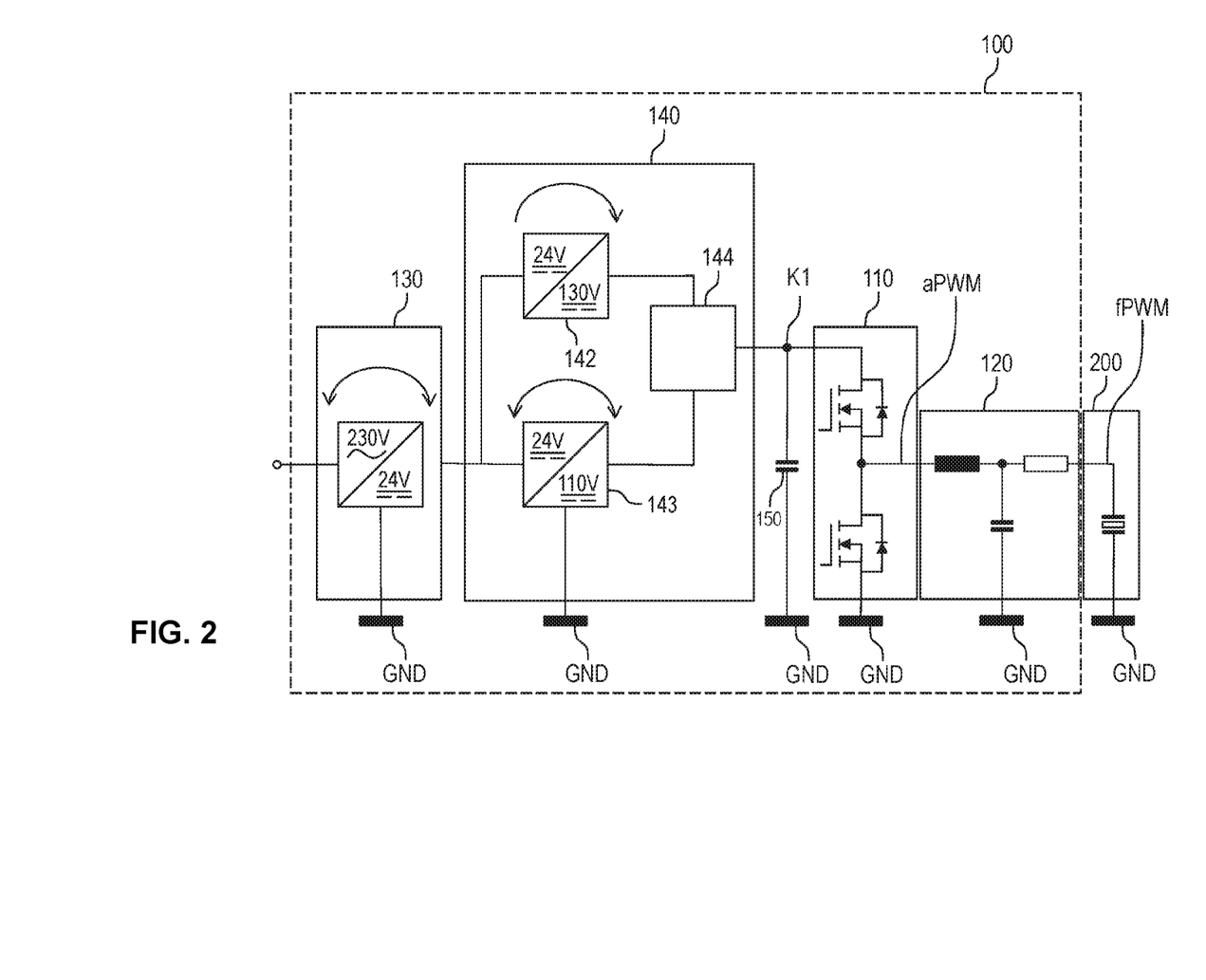
FIG. 2 shows a schematic block diagram of a drive device for driving an actuator of an optical system.

FIG. 2 shows a schematic block diagram of a second embodiment of a drive device 100 for driving an actuator 200 of an optical system 300.

The drive device 100 in FIG. 2 differs from the drive device 100 in FIG. 1 in terms of the configuration of the two-quadrant controller 140.

The two-quadrant controller 140 in FIG. 2 has a parallel connection of a boost controller 142 for feeding in energy to the switching amplifier 110 and a synchronous boost controller 143 for feeding back energy to the voltage source 130 having feedback capability, and a linear voltage regulator 144 connected downstream of the parallel connection. The linear voltage regulator 144 is connected to the switching amplifier 110 via the first node K1.

Figure 3:
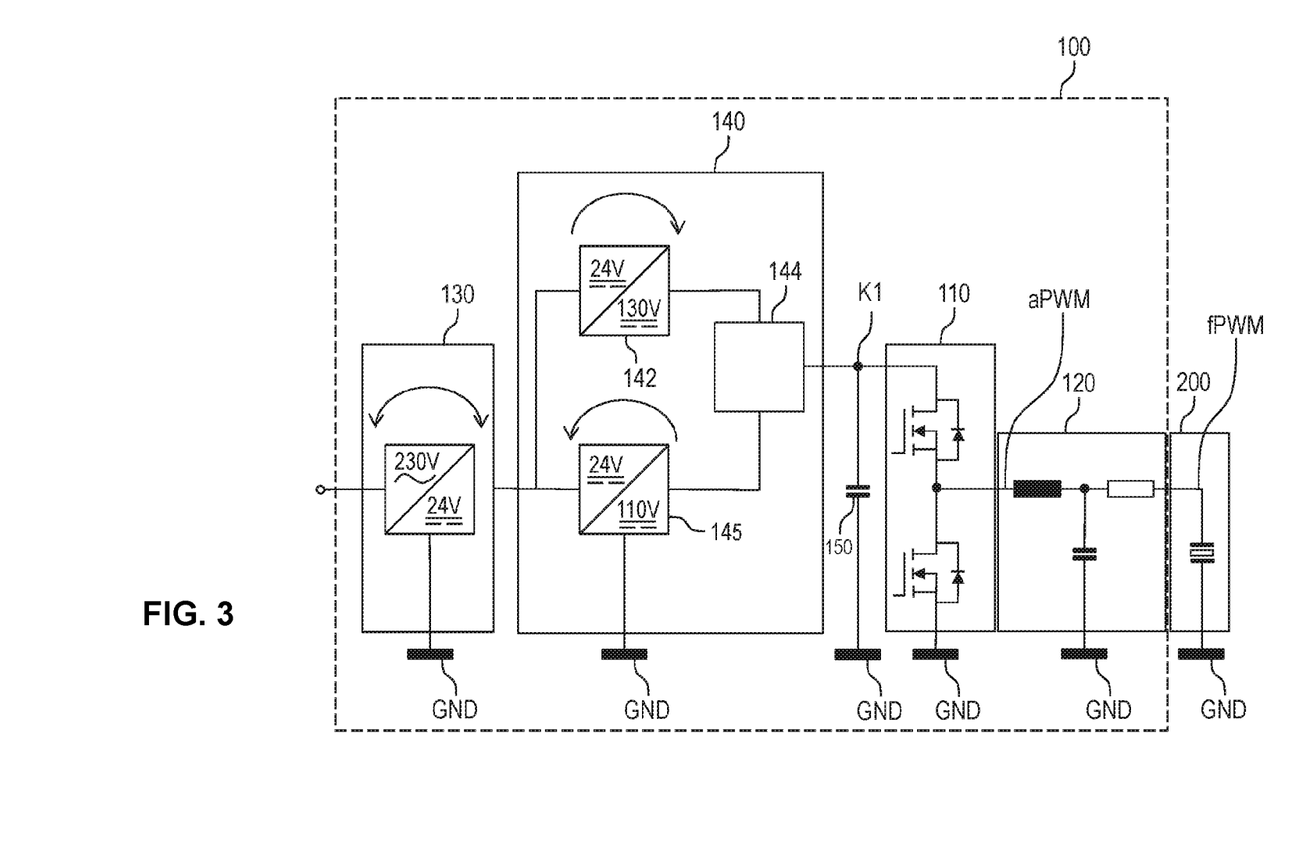
FIG. 3 shows a schematic block diagram of a drive device for driving an actuator of an optical system.

FIG. 3 shows a schematic block diagram of a third embodiment of a drive device 100 for driving an actuator 200 of an optical system 300. The drive device 100 in FIG. 3 is based on the first embodiment of the drive device 100 in FIG. 1 and differs in terms of the configuration of the two-quadrant controller 140. The two-quadrant controller 140 in FIG. 3 has a parallel connection of a boost controller 142 for feeding in energy to the switching amplifier 110 and a buck controller 145 for feeding back energy to the voltage source 130 having feedback capability, and a linear voltage regulator 144 connected downstream of the parallel connection and connected to the switching amplifier 110 via the first node K1.

If the embodiment of the two-quadrant controller 140 in FIG. 2 and the embodiment of the two-quadrant controller 140 in FIG. 3 are compared, then it can be ascertained that the embodiment of FIG. 3 has a buck controller 145 instead of the synchronous boost controller 143.

Figure 4:
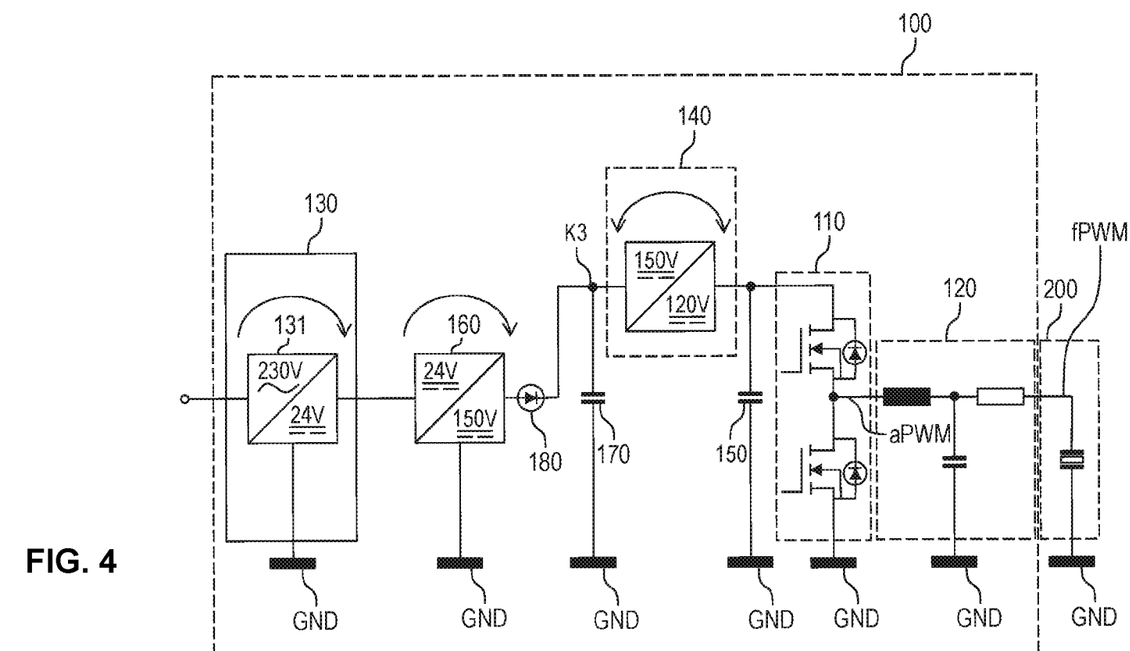
FIG. 4 shows a schematic block diagram of a drive device for driving an actuator of an optical system.

FIG. 4 shows a schematic block diagram of a fourth embodiment of a drive device 100 for driving an actuator 200 of an optical system 300.

In the fourth embodiment in accordance with FIG. 4, the voltage source is embodied as a buck controller 131. A boost controller 160 is arranged between the buck controller 131 and the two-quadrant controller 140 in FIG. 4. By way of example, the buck controller 131 converts an input-side AC voltage of 230 V into an output-side DC voltage of 24 V. The boost controller 160 is configured to step up the DC voltage of 24 V, provided by the buck controller 131, to a DC voltage of 150 V. The boost controller 160 and the two-quadrant controller 140 are coupled via a third node K3. A storage element 170, for example a capacitance, for energy fed back from the actuator 200 is connected between the third node K3 and ground GND. Moreover, a diode 180 is connected between the boost controller 160 and the third node K3.

FIG. 5 shows a schematic block diagram of an embodiment of an optical system 300 comprising a plurality of actuatable optical elements 310. The optical system 300 is embodied here as a micromirror array, wherein the optical elements 310 are micromirrors. Each micromirror 310 is actuatable via an assigned actuator 200. By way of example, a respective micromirror 310 can be tilted about two axes and/or displaced in one, two, or three spatial axes via the assigned actuator 200. The reference signs only of the topmost row of these elements are depicted, for reasons of clarity.

The optical system 300 comprises a correction unit 320 configured for generating a drive signal A or an input signal I for each of the micromirrors 310. By way of example, the optical system 300 is configured for correcting a wavefront of light in a lithography apparatus 600A, 600B (see FIGS. 6A, 6B), wherein the correction unit 320, for example, depending on a measured shape of the wavefront and a target shape of the wavefront, determines a target position of each of the micromirrors 310 and outputs a corresponding drive signal A or input signal I.

The respective drive signal A or input signal I is fed to a drive device 100 assigned to a respective actuator 200. The drive device 100 drives the respective actuator 200 with a filtered, amplified modulation signal fPWM. The filtered signal fPWM is generated for example as described with reference to any of FIGS. 1 to 4. A position of the respective micromirror 310 is thus set.

FIG. 6A shows a schematic view of an EUV lithography apparatus 600A comprising a beam-shaping and illumination system 602 and a projection system 604. In this case, EUV stands for "extreme ultraviolet" and denotes a wavelength of the working light of between 0.1 nm and 30 nm. The beam-shaping and illumination system 602 and the projection system 604 are respectively provided in a vacuum housing (not shown), wherein each vacuum housing is evacuated with the aid of an evacuation apparatus (not shown). The vacuum housings are surrounded by a machine room (not shown), in which drive devices for mechanically moving or setting optical elements are provided. Moreover, electrical controllers and the like can also be provided in this machine room.

The EUV lithography apparatus 600A comprises an EUV light source 606A. A plasma source (or a synchrotron), which emits radiation 608A in the EUV range (extreme ultraviolet range), that is to say for example in the wavelength range of 5 nm to 20 nm, can for example be provided as the EUV light source 606A. In the beam-shaping and illumination system 602, the EUV radiation 608A is focused and the desired operating wavelength is filtered out from the EUV radiation 608A. The EUV radiation 608A generated by the EUV light source 606A has a relatively low transmissivity through air, for which reason the beam-guiding spaces in the beam-shaping and illumination system 602 and in the projection system 604 are evacuated.

The beam-shaping and illumination system 602 illustrated in FIG. 6A has five mirrors 610, 612, 614, 616, 618. After passing through the beam-shaping and illumination system 602, the EUV radiation 608A is guided onto a photomask (reticle) 620. The photomask 620 is likewise embodied as a reflective optical element and can be arranged outside the systems 602, 604. Furthermore, the EUV radiation 608A can be directed onto the photomask 620 via a mirror 622. The photomask 620 has a structure which is imaged onto a wafer 624 or the like in a reduced fashion via the projection system 604.

The projection system 604 (also referred to as a projection lens) has five mirrors M1 to M5 for imaging the photomask 620 onto the wafer 624. In this case, individual mirrors M1 to M5 of the projection system 604 can be arranged symmetrically in relation to an optical axis 626 of the projection system 604. It should be noted that the number of mirrors M1 to M6 of the EUV lithography apparatus 600A is not restricted to the number represented. A greater or lesser number of mirrors M1 to M5 can also be provided. Furthermore, the mirrors M1 to M5 are generally curved at their front side for beam shaping.

Furthermore, the projection system 604 comprises an optical system 300 having a plurality of actuatable optical elements 310, for example the micromirror array described with reference to FIG. 5. The optical system 300 is configured for example for correcting dynamic imaging aberrations. The projection system 604 comprising the optical system 300 can be referred to as an adaptive optical unit. A resolution of the lithography apparatus 600A can thereby be increased. By way of example, depending on measured values of the wavefront of the projection light, a correction unit 320 generates an input signal I, which can comprise an individual signal for example for a respective micromirror 310. The input signal I is converted into an amplified, filtered modulation signal fPWM by the drive device 100 for a respective optical element 310, and output to the respective actuator 200 for actuating the optical element 310. The respective actuator 200 correspondingly actuates the assigned micromirror 310. It should be pointed out that the arrangement of the drive device 100 within the projection system 604 is optional.

FIG. 6B shows a schematic view of a DUV lithography apparatus 600B, which comprises a beam-shaping and illumination system 602 and a projection system 604. In this case, DUV stands for "deep ultraviolet" and denotes a wavelength of the working light of between 30 nm and 250 nm. As has already been described with reference to FIG. 6A, the beam-shaping and illumination system 602 and the projection system 604 can be arranged in a vacuum housing and/or be surrounded by a machine room with corresponding drive devices.

The DUV lithography apparatus 600B has a DUV light source 606B. By way of example, an ArF excimer laser that emits radiation 608B in the DUV range at 193 nm, for example, can be provided as the DUV light source 606B.

The beam-shaping and illumination system 602 illustrated in FIG. 6B guides the DUV radiation 608B onto a photomask 620. The photomask 620 is embodied as a transmissive optical element and can be arranged outside the systems 602, 604. The photomask 620 has a structure which is imaged onto a wafer 624 or the like in a reduced fashion via the projection system 604.

The projection system 604 has a plurality of lens elements 628 and/or mirrors 630 for imaging the photomask 620 onto the wafer 624. In this case, individual lens elements 628 and/or mirrors 630 of the projection system 604 can be arranged symmetrically in relation to an optical axis 626 of the projection system 604. It should be noted that the number of lens elements 628 and mirrors 630 of the DUV lithography apparatus 600B is not restricted to the number represented. A greater or lesser number of lens elements 628 and/or mirrors 630 can also be provided. Furthermore, the mirrors 630 are generally curved at their front side for beam shaping.

Furthermore, the projection system 604 comprises an optical system 300 having a plurality of actuatable optical elements 310, for example a microlens element array, which can be constructed for example according to the micromirror array described with reference to FIG. 5, wherein microlens elements are used instead of the micromirrors. The optical system 300 is configured for example for correcting dynamic imaging aberrations. The projection system 604 comprising the optical system 300 can be referred to as an adaptive optical unit. A resolution of the lithography apparatus 600B can thereby be increased. In order to improve the imaging performance, in the present case a drive signal A is predefined from outside. The drive signal A comprises, for example, an individual signal for each of the microlens elements 310 of the optical system 300. The drive signal A can be generated by an external computing device, for example. The drive device 100 converts the signal contained in the drive signal A for a respective microlens element 310 into an amplified, filtered modulation signal fPWM and outputs the latter to the respective actuator 200. The respective actuator 200 correspondingly actuates the assigned microlens element 310.

An air gap between the last lens element 628 and the wafer 624 may be replaced by a liquid medium 632 which has a refractive index of >1. The liquid medium 632 may be for example high-purity water. Such a construction is also referred to as immersion lithography and has an increased photolithographic resolution. The medium 632 can also be referred to as immersion liquid.

Figure 7:
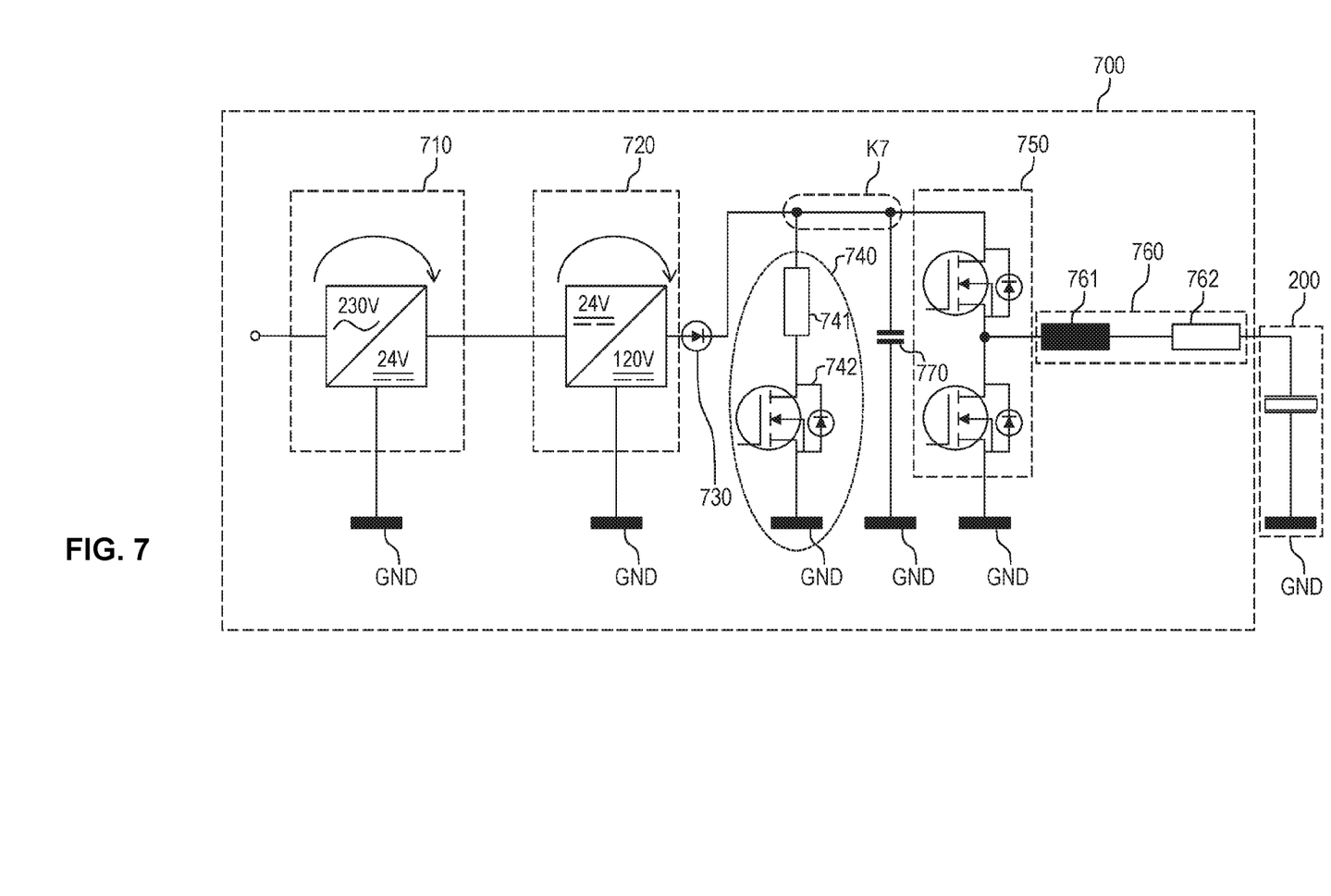
FIG. 7 shows a block diagram of an example of a drive device for driving an actuator of an optical system.

FIG. 7 shows a block diagram of a further example of a drive device 700 for driving an actuator 200 of an optical system 300.

The drive device 700 in FIG. 7 comprises a providing unit comprising a buck controller 710 and a boost controller 720 connected downstream, a switching amplifier 750 and a filter unit 760. A diode 730 is arranged between the boost controller 720 and the switching amplifier 750. The diode 730 and the switching amplifier 750 are connected to one another via a node K7. A chopper circuit 740 for energy fed back from the actuator 200 is connected between the node K7 and ground GND. The chopper circuit 740 has a series connection of a resistor 741 and a transistor 742. A link circuit capacitor 770 is connected in parallel with the chopper circuit 740.

Although the present disclosure has been described on the basis of exemplary embodiments, it is modifiable in diverse ways.

LIST OF REFERENCE SIGNS

100 Drive device
110 Switching amplifier
120 Filter unit
121 Inductance
122 Resistor
123 Capacitor
130 Providing unit
131 Buck controller
140 Two-quadrant controller
141 Synchronous boost controller
142 Boost controller
143 Synchronous boost controller
144 Voltage regulator
145 Buck controller
150 Link circuit capacitor
160 Boost controller
170 Storage element
180 Diode
200 Actuator
300 Optical system
310 Optical element
320 Correction unit
600A EUV lithography apparatus
600B DUV lithography apparatus
602 Beam-shaping and illumination system
604 Projection system
606A EUV light source
606B DUV light source
608A EUV radiation
608B DUV radiation
610 Minor
612 Minor
614 Minor
616 Minor
618 Minor
620 Photomask
622 Minor
624 Wafer
626 Optical axis
628 Lens element
630 Minor
632 Medium
700 Drive device
710 Buck controller
720 Boost controller
730 Diode
740 Chopper circuit
741 Resistor
742 Transistor
750 Switching amplifier
760 Filter unit
761 Inductance
762 Resistor
770 Link circuit capacitor
aPWM Amplified signal
A Drive signal
fPWM Filtered signal
GND Ground potential
I Input signal
K1 Node
K2 Node
K3 Node
K7 Node
M1 Mirror
M2 Mirror
M3 Mirror
M4 Minor
M5 Mirror

What is claimed is:

1. A drive device configured to drive an actuator of an optical system, the drive device comprising:
a switching amplifier configured to generate an amplified signal depending on a modulation signal;
a filter unit connected between the actuator and the switching amplifier, the filter unit having an inductance;
a providing unit configured to provide a supply voltage, the providing unit having feedback capability; and
a two-quadrant controller having feedback capability coupled between the providing unit and the switching amplifier, the two-quadrant controller comprising:
a parallel connection of a boost controller configured to feed in energy to the switching amplifier, and
a synchronous boost controller configured to feed back energy to the providing unit, the synchronous boost controller being connected in parallel to the boost controller; and
a linear voltage regulator connected downstream of the parallel connection and coupled to the switching amplifier.

2. The drive device of claim 1, wherein the two-quadrant controller is configured to convert an input voltage present on a providing unit side into an output voltage present on a switching amplifier side, and to convert an input voltage present on the switching amplifier side into an output voltage present on the providing unit side.

3. The drive device of claim 1, wherein the two-quadrant controller is configured to step up an input voltage present on a providing unit side into an output voltage present on a switching amplifier side, and to step down an input voltage present on the switching amplifier side into an output voltage present on the providing unit side.

4. The drive device of claim 1, further comprising a link circuit capacitor, wherein the two-quadrant controller and the switching amplifier are connected via a node, and the link circuit capacitor is connected between the node and ground.

5. The drive device of claim 1, wherein the two-quadrant controller comprises a synchronous boost controller, and the providing unit and the synchronous boost controller are connected via a node.

6. The drive device of claim 1, wherein the two-quadrant controller comprises:

a parallel connection of a boost controller configured to feed in energy to the switching amplifier;
a buck controller configured to feed back energy to the providing unit; and
a linear voltage regulator connected downstream of the parallel connection and coupled to the switching amplifier.

7. The drive device of claim 1, wherein the providing unit comprises a buck controller.

8. The drive device of claim 7, wherein a boost controller is connected between the buck controller and the two-quadrant controller.

9. The drive device of claim 8, further comprising a storage element, wherein the boost controller and the two-quadrant controller are coupled via a node, and the storage element is configured so that energy fed back from the actuator is connected between the node and ground.

10. The drive device of claim 9, further comprising a diode connected between the boost controller and the node.

11. The drive device of claim 1, wherein the switching amplifier comprises a half H-bridge.

12. The drive device of claim 1, wherein the filter unit comprises a resistor and a capacitance.

13. An optical system, comprising:
a plurality of drive devices according to claim 1;
a plurality of actuatable optical elements; and
a plurality of actuators,
wherein each of the actuatable optical elements is assigned an actuator, and each actuator is assigned a drive device.

14. The optical system of claim 13, wherein at least one of the actuators comprises at least one member selected from the group consisting of a capacitive load and an inductive load.

15. An apparatus, comprising:
an optical system, comprising:
a plurality of drive devices according to claim 1;
a plurality of actuatable optical elements; and
a plurality of actuators,
wherein each of the actuatable optical elements is assigned an actuator, each actuator is assigned a drive device, and the apparatus comprises a lithography apparatus.

16. A drive device configured to drive an actuator of an optical system, the drive device comprising:
a switching amplifier configured to generate an amplified signal depending on a modulation signal;
a filter unit connected between the actuator and the switching amplifier, the filter unit having an inductance;
a providing unit configured to provide a supply voltage, the providing unit having feedback capability; and
a two-quadrant controller having feedback capability coupled between the providing unit and the switching amplifier,
wherein the two-quadrant controller comprises:
a parallel connection of a boost controller configured to feed in energy to the switching amplifier, and
a buck controller configured to feed back energy to the providing unit, the buck controller being connected in parallel to the boost controller; and
a linear voltage regulator connected downstream of the parallel connection and coupled to the switching amplifier.

17. An optical system, comprising:
a plurality of drive devices according to claim 16;
a plurality of actuatable optical elements; and
a plurality of actuators,
wherein each of the actuatable optical elements is assigned an actuator, and each actuator is assigned a drive device.

18. An apparatus, comprising:
an optical system, comprising:
a plurality of drive devices according to claim 16;
a plurality of actuatable optical elements; and
a plurality of actuators,
wherein each of the actuatable optical elements is assigned an actuator, each actuator is assigned a drive device, and the apparatus comprises a lithography apparatus.

19. A drive device configured to drive an actuator of an optical system, the drive device comprising;
a switching amplifier configured to generate an amplified signal depending on a modulation signal;
a filter unit connected between the actuator and the switching amplifier, the filter unit having an inductance;
a providing unit configured to provide a supply voltage; and
a two-quadrant controller having feedback capability coupled between the providing unit and the switching amplifier,
wherein the providing unit comprises a buck controller, and a boost controller is connected between the buck controller and the two-quadrant controller.

20. An optical system, comprising:
a plurality of drive devices according to claim 19;
a plurality of actuatable optical elements; and
a plurality of actuators,
wherein each of the actuatable optical elements is assigned an actuator, and each actuator is assigned a drive device.

* * * * *

UNITED STATES PATENT AND TRADEMARK OFFICE
CERTIFICATE OF CORRECTION

PATENT NO. : 12,153,353 B2
APPLICATION NO. : 17/967163
DATED : November 26, 2024
INVENTOR(S) : Oliver Herbst and Cornelius Richt Page 1 of 1

It is certified that error appears in the above-identified patent and that said Letters Patent is hereby corrected as shown below:

On the Title Page

Page 2, Column 1, Item (56), Line 3, delete "Act_uator98.pdf." insert -- Actuator98.pdf. --.

In the Specification

Column 11, Line 52, delete "610 Minor" insert -- 610 Mirror --.

Column 11, Line 53, delete "612 Minor" insert -- 612 Mirror --.

Column 11, Line 54, delete "614 Minor" insert -- 614 Mirror --.

Column 11, Line 55, delete "616 Minor" insert -- 616 Mirror --.

Column 11, Line 56, delete "618 Minor" insert -- 618 Mirror --.

Column 11, Line 58, delete "622 Minor" insert -- 622 Mirror --.

Column 11, Line 62, delete "630 Minor" insert -- 630 Mirror --.

Column 12, Line 21, delete "M4 Minor" insert -- M4 Mirror --.

Signed and Sealed this
Eleventh Day of February, 2025

Coke Morgan Stewart
*Acting Director of the United States Patent and Trademark Office*